United States Patent
Kim et al.

(10) Patent No.: US 6,950,353 B1
(45) Date of Patent: Sep. 27, 2005

(54) CELL DATA MARGIN TEST WITH DUMMY CELL

(75) Inventors: Hoki Kim, Hopewell Junction, NY (US); Toshiaki Kirihata, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/906,051

(22) Filed: Feb. 1, 2005

(51) Int. Cl.$^7$ ............................................. G11C 7/00
(52) U.S. Cl. ....................... 365/200; 365/201; 365/233
(58) Field of Search ................................ 365/210, 200, 365/201, 190, 233, 189.06, 189.09, 202

(56) References Cited

U.S. PATENT DOCUMENTS

| | | | |
|---|---|---|---|
| 4,468,759 A | 8/1984 | Kung et al. | |
| 5,544,108 A | 8/1996 | Thomann | |
| 5,592,427 A | 1/1997 | Kumakura et al. | |
| 6,104,650 A | 8/2000 | Shore | |
| 6,614,690 B2 | 9/2003 | Roohparvar | |
| 2004/0242009 A1 | 12/2004 | Banks | |

Primary Examiner—Son T. Dinh
Assistant Examiner—Hien Nguyen
(74) Attorney, Agent, or Firm—Graham S. Jones, II; H. Daniel Schnurmann

(57) ABSTRACT

A memory array includes a true bitline and a complementary bitline and a sense amplifier connected thereto; a row of normal cells with capacitors for data storage and bitline storage capacitors. A row of dummy cells with dummy cell capacitors is also provided. A clock provides wordline drive signals to the normal cells. When operating in the test mode, the clock provides at least one dummy wordline drive signal to the dummy cell switch in response to a testing signal for connecting the dummy cell capacitor to the bitline. A plurality of rows of dummy cells can be employed with various permutations of actuation thereof to provide various levels of capacitance connected to the bitlines in the test mode.

20 Claims, 5 Drawing Sheets

CELL DATA MARGIN TEST WITH DUMMY CELL

BACKGROUND

In the process of manufacturing semiconductor memory devices it is desirable to improve product reliability by performing screening examinations of memory devices such as semiconductor chips. One goal of such an examination is to determine which memory devices, e.g. chips, are defective. Another goal of such an examination is to determine which memory devices (chips) include weak cells. A most commonly used technique for attempting to achieve this objective is to measure the rate of data retention while varying the data retention time. However, there is the disadvantage that measuring data retention times during screening examinations of memory chips is a very expensive process.

Another concern is that there is no way to determine the relevant characteristics of each memory cell within an array. For example there is a concern about cell capacitors, bitline capacitors and the relationship between a particular cell capacitor and a particular bitline capacitor during the development phase. Even if one can make that determination, the result must be achieved with a special test vehicle; not by a measurement from an actual memory array.

U.S. Pat. No. 4,468,759 of Kung, et al. entitled "Testing method and apparatus for DRAM" states in the abstract "A method for testing an MOS, dynamic random-access memory employing full capacitance dummy cells is described. During probe testing a potential higher than the reference potential is applied to the dummy cells when reading binary zeroes from the memory and a potential lower than the reference potential is applied to the dummy cells when reading binary zeroes from the memory. This testing procedure detects weak cells and amplifiers and helps present the packaging of defective parts. In addition, a simplified means for programming redundant elements is described which requires substantially less substrate area than previous methods."

U.S. Pat. No. 5,544,108 of Thomann entitled "Circuit And Method For Decreasing the Cell Margin During a Test Mode" indicated that during a read mode when a first cell has been selected the first access transistor of the selected first cell actuates and couples the charge stored on the first storage capacitor of the first cell to its respective digit line. The charge stored in the first storage capacitor has a potential different than the potential of the digit line. This difference between the potential of the first storage capacitor and the potential of the digit line is the cell margin. The patent states further that "The N-sense amplifier senses the cell margin and determines what data has been stored in the cell. Next the N-sense amplifier amplifies the potential of the digit line to reflect the value of the potential stored in the cell. Once amplified the digit line in electrical communication with the selected cell has a potential representing the data bit stored in the storage capacitor, and the remaining digit line of the digit line pair has a potential equal to the complement of the data bit stored in the storage capacitor of the selected cell."

In accordance with this invention, a dummy memory cell within a memory array is used to simulate or measure the cell data margin. Additional capacitors added to the bit line capacitor from the dummy memory cell will vary the capacitor ratio between a bitline capacitor and a cell storage capacitor. This leads to a change in the signal value developed at the bitline from the normal memory cell when the nominal cell wordline is selected. In this way, one can easily detect which cells are the weak cells at an early phase of product development before commencement of refresh testing or prior to shipping of commercial products.

GLOSSARY

Cell margin . . . "The difference between the potential of a storage capacitor and the potential of the digit line" of U.S. Pat. No. 5,544,108 of Thomann (cited above); "The sense amplifiers then sense the differential, or cell margin, across the digit line pair." U.S. Pat. No. 6,104,650 of Shore; and "For a single-bit memory cell, margin is defined as the additional voltage threshold needed to insure that the programmed cell will retain its stored value over time. U.S. Patent Application 20040242009 of Banks entitled "Electrically Alterable Non-Volatile Memory With N-Bits Per Cell."

Cell data margin . . . Cell Margin and Cell data margin have the same meanings

Data margin . . . Short for cell data margin

Digit line . . . Bitline or bit line

Dummy cell . . . A cell within a memory cell array not used for regular storage. In some cases a dummy cell is added between regular memory cell array and peripheral circuits such as a Sense Amp to eliminate a topology gap.

Normal cell . . . A regular cell used for normal (regular) storage operations.

DETAILED DESCRIPTION OF THE PREFERRED EMBODIMENT

Figure 1:
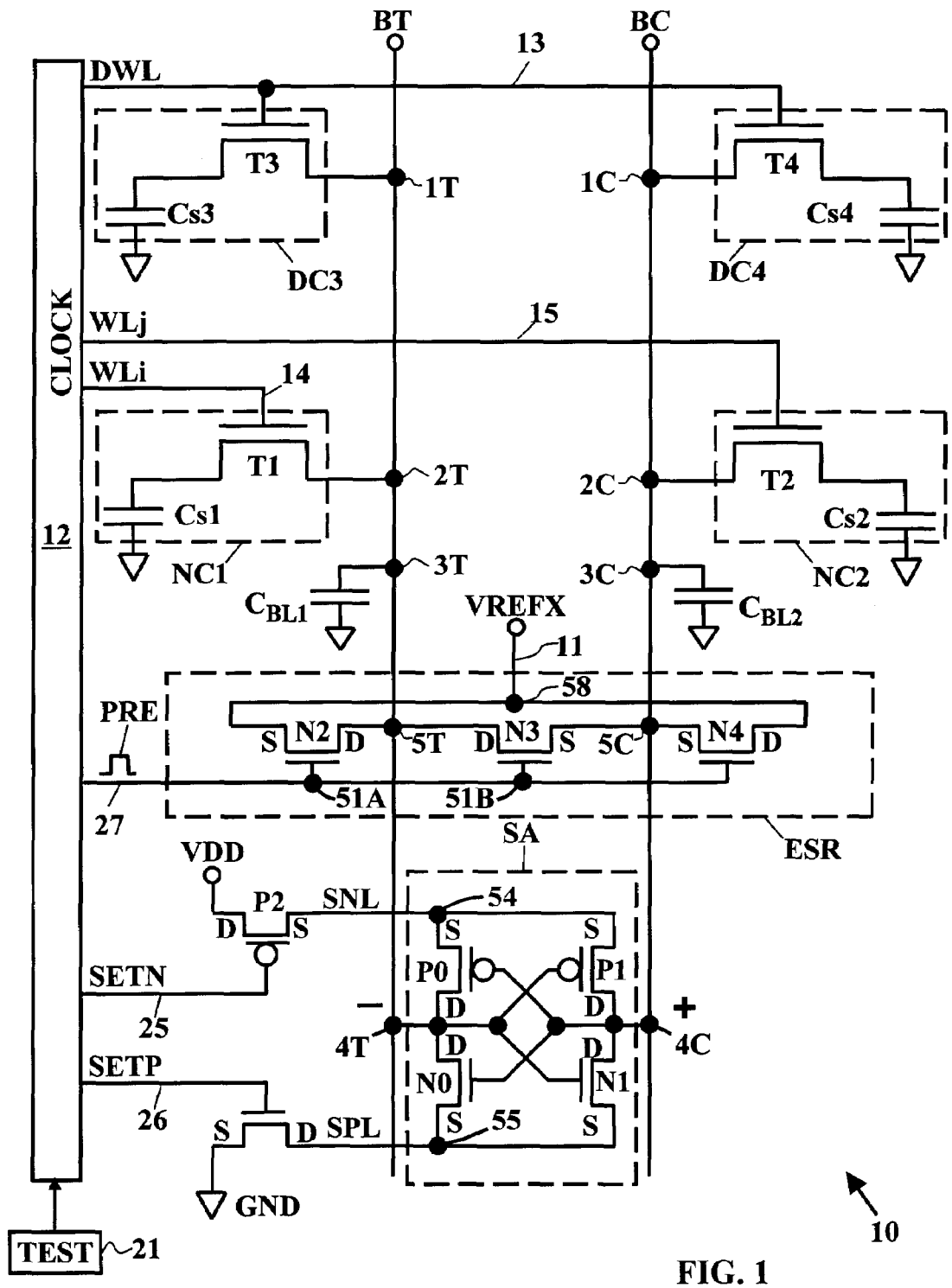
FIG. 1 is a schematic circuit diagram of a memory system in accordance with this invention including a bit line pair connection of a memory cell that includes two normal cells in a row of normal cells and two dummy cells in a row of dummy cells for screening defective cells by measuring the cell data margin.
Figure 2A:
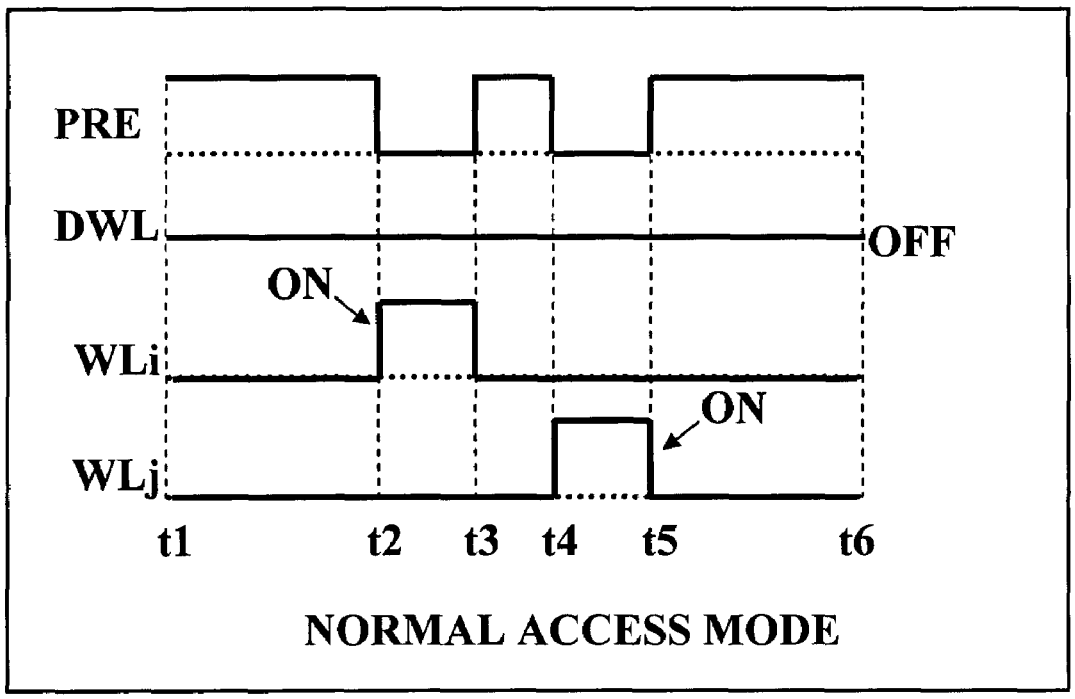
FIGS. 2A and 2B show two timing diagrams of the activated and un-activated mode of operation of the system of FIG. 1.
Figure 2B:
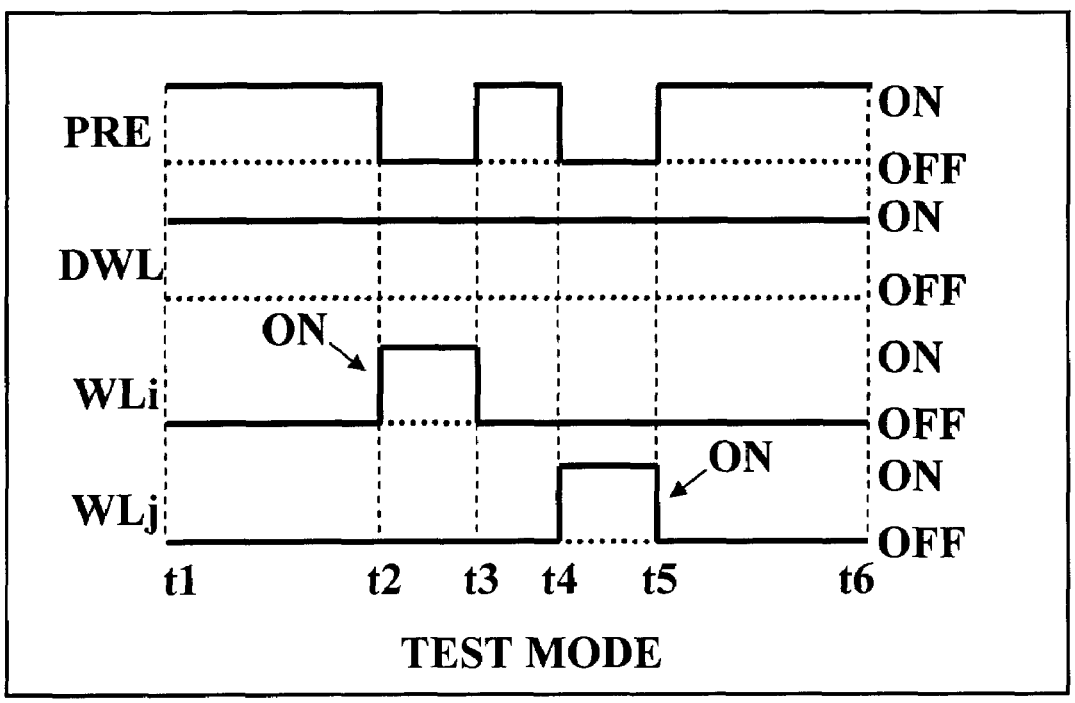

FIG. 1 is a schematic circuit diagram of a memory system 10 in accordance with this invention including a one bit line pair connection of a memory cell that includes two normal cells NC1 and NC2 in a row of normal cells and two dummy cells DC3 and DC4 in a row of dummy cells for screening defective cells by measuring the cell data margin. The row of dummy cells represented by cell DC3 and cell DC4 and the row of normal cells represented by cell NC1 and NC2 are included within the same array. The bitline pair includes a true bitline BT connected to nodes 1T to 5T and a complementary bitline BC connected to nodes 1C to 5C. The true bitline BT is connected through the node 1T to address dummy cell DC3 and through the node 2T to address true normal cell NC1 and other elements of the circuit 10. The complementary bitline BC is connected through node 1C to address dummy cell DC4 and through node 2C to address complementary normal cell NC2 and other elements of the circuit 10. FIGS. 2A and 2B show two timing diagrams of the activated and un-activated mode of operation of the system 10 of FIG. 1 from time t1 to t6.

A clock 12 includes a TEST input 21, output lines including dummy word line 13, wordline WLi 14, wordline WLj 15, and lines to a cross coupled sense amplifier including SETN line 25 and SETP line 26.

Each of the two normal cells NC1 and NC2 and each of the two dummy cells DC3 and DC4 includes a single storage capacitor Cs and an NFET transistor with the source drain circuit in series with one terminal of the capacitor Cs and the other terminal of the capacitor Cs connected to ground GND.

The normal cell NC1 includes the NFET T1 and the storage capacitor Cs1. Transistor T1 has one end of its source/drain circuit connected to a terminal of a storage capacitor Cs1, which is connected at its other terminal to reference potential ground (GND). The other ends of the source/drain circuits of memory cell transistor T1 is connected through node 2T to the true bitline BT.

The normal cell NC2 includes the NFET T2 and the storage capacitor Cs2. Transistor T2 has one end of its source/drain circuit connected to a terminal of a storage capacitor Cs2, which is connected at its other terminal to reference potential ground (GND). The other ends of the source/drain circuits of memory cell transistor T2 is connected via node 2C to the complementary bitline BC.

The dummy cell DC3 includes NFET T3 and storage capacitor Cs3. Transistor T2 has one end of its source/drain circuit connected to a terminal of a storage capacitor Cs3, which is connected at its other terminal to reference potential ground (GND). The other ends of the source/drain circuit of the dummy cell transistor T3 is connected through node 1T to the true bitline BT.

The dummy cell DC4 includes NFET T4 and storage capacitor Cs4. Transistor T4 has one end of its source/drain circuit connected to a terminal of a storage capacitor Cs4, which is connected at its other terminal to reference potential ground (GND). The other ends of the source/drain circuits of the dummy cell transistor T4 is connected through node 1C to the complementary bitline BC.

In summary, each of the transistors T1, T2, T3, and T4 has one end of its source/drain circuit connected respectively to a terminal of a storage capacitor Cs1, Cs2, Cs3, and Cs4. Each of those capacitors is connected at its other terminal to reference potential ground (GND). The other ends of the source/drain circuits of transistors T1/T3 are connected through nodes 2T/1T to the true bitline BT. The other ends of the source/drain circuits of transistors T2/T4 are connected through nodes 2C/1C to the complementary bitline BC.

The source/drain circuit of the transistor T1 connects between the true bitline BT and one terminal of the capacitor Cs1. The source/drain circuit of the transistor T2 connects between the complementary bitline BC and one terminal of the capacitor Cs2. The source/drain circuit of the transistor T3 is connected between the true bitline BT and one terminal of the capacitor Cs3. The source/drain circuit of the transistor T4 connects between the complementary bitline BC and one terminal of the capacitor Cs4.

The clock 12 includes an output line comprising dummy word line 13, which is adapted to supply a test signal DWL on line 13 to the gates of the pair of dummy transistors T3 and T4 for activating testing by turning on the two dummy transistors T3 and T4.

Normal wordlines 21 and 22 supply wordline signals WLi and WLj respectively to the gates of the transistors T1 and T2 of the normal cells NC1 and NC2 respectively.

The storage capacitors Cs1, Cs2, Cs3, and Cs4 are assumed to have substantially equal capacitance values of Cs.

The true bitline BT and complementary bitline BC are also connected to the negative and positive terminals respectively of a sense amplifier SA. The dummy wordline 13 supplies a test signal DWL to the gates of NFETS T1 and T2.

There is a precharge circuit VREFX-short-circuiting equalization circuit ESR which short circuits the true bitline BT and the complementary bitline BC together and at the same time connects them to precharge potential VREFX during times t1 to t2, t3 to t4 and t5 to t6 in FIGS. 2A and 2B. The precharge circuit ESR includes short circuiting NFET N3 and reference potential NFETs N2 and N4. All three equalization NFETs N2, N3, and N4 of the VREFX-short-circuiting equalization circuit ESR have their gates connected via connections to line 27 to be turned ON when they receive the reference potential equalization pulse PRE on the reference potential equalization line 27. The drain of the centrally located equalization NFET N3 is connected via node 5T to the true bitline BT and its source connected to the complementary bitline BC via node 5C so that when the NFET N3 conducts, it short circuits the true bitline BT to the complementary bitline BC. Equalization NFET N2 has its drain connected to the true bitline BT via node 5T, and its source connected to the reference potential source VREFX via node 58 and line 11. The equalization NFET N4 has its source connected to the complementary bitline BC via node 5C and its drain connected to the voltage source VREFX via node 58 and line 11. When NFETs N2 and N4 are ON they connect the true bitline BT and the complementary bitline BC to the reference potential source VREFX via node 58 and line 11. At the same time, the NFET N3 short circuits the lines BT and BC together via nodes 5T and 5C. The result is that the potential on the true bitline BT and the complementary bitline BC is equalized rapidly.

In operation, the precharge line 27 is connected to receive the short circuiting (reference potential) equalization pulse PRE which is shown in the signal timing diagrams of FIGS. 2A and 2B from clock 12. During an equalization phase of operation of the system 10 from times t1 to t2, t3 to t4 and t5 to t6 in each cycle the reference potential equalization pulse PRE from clock 12 is applied on the reference potential equalization line ERL to circuit ESR to raise the gate of NFET N3 turning it ON to provide a short circuit connection between the true bitline BT and the complementary bitline BC. At the same time equalization pulse PRE is applied to the gates of NFETS N2/N4 which turns them on so that they connect both the true bitline BT and the complementary bitline BC to charge or discharge them to the potential of the reference voltage source VREFX.

When the WLi signal on line 14 is high, it activates the gate of the NFET T1 to turn normal cell NC1 ON so that is conducts, thereby connecting the node of capacitor Cs1 through node 2T to true bitline BT. The WLi signal is high from time t2 to t3 as shown in FIGS. 2A and 2B.

When the WLj signal on line 15 is high, it activates the gate of the NFET T2 to turn normal cell NC2 ON so that is conducts, thereby connecting the node of capacitor Cs2 through node 2C to complementary bitline BC. The WLj signal is high from time t4 to t5 as shown in FIGS. 2A and 2B.

To differentiate between the normal access mode and the test mode, test signal DWL and signals WLi and WLj are controlled by using a test mode pin, as will be well understood by those skilled in the art. The test mode pin is an additional external PIN that is provided to permit changing modes of operation between the normal access mode and the test mode. The test signal is normally OFF, but is activated when test block 21 signals clock 12 to turn on signal DWL on line 13.

FIGS. 2A and 2B show two timing diagrams of the activated and un-activated mode of operation of the system 10 of FIG. 1 from time t1 to t6.

Referring to FIG. 2A, the test signal DWL on the dummy wordline 13 is deactivated, i.e. OFF, when the mission mode (normal access mode) is enabled and the storage capacitors Cs3 and Cs4 of the dummy cells DC3 and DC4 are completely isolated from the true bitline BT and the complementary bitline BC.

Referring to FIG. 2B, the signal DWL on dummy wordline 13 is activated (i.e. turned ON) only when test mode is enabled and the storage capacitors Cs3 and Cs4 of the dummy cells 17 and 18 are both charged to the same level as bitline precharge level, because the test signal DWL raises the gates of the dummy cells transistors DT1 and DT2.

During operation in the normal access mode of operation, at time t2 the signal WLi on the wordline 14 turns ON raising the gate of transistor T1, which connects the node 2T to the node of capacitor Cs1, which as stated above has its other terminal connected to GND. Thus charge flows between the bitline BT and the capacitor Cs1 to contribute charge to capacitor Cs1 until time t2 when the signal WLi is OFF on wordline 14. At time t4 the signal WLj on wordline 15 turns ON raising the gate of transistor T2, which connects the node 2C to the node of capacitor Cs2, which as stated above has its other terminal connected to GND. Thus charge flows between the bitline BC and capacitor Cs2 to contribute charge to capacitor Cs2 until time t5 when signal WLj is OFF on wordline 15.

During operation in the normal access mode of operation continuously from times t1 to t6, the dummy cells DC1 and DC2 are unable to contribute charge to the true bitline capacitor $C_{BL1}$ or to complementary bitline capacitor $C_{BL2}$. When wordline WLi is activated, the signal developed at true bitline BT is determined by the capacitor ratio of the capacitance value $C_{BL}$ of the true bitline capacitor $C_{BL1}$ to the capacitance value Cs of the storage capacitor Csi, as follows:

$$Vsignal = Cs*VDD/(Cs+C_{BL}) \quad \text{(Equation 1)}$$

where:

Cs is the capacitance of each normal cell and each dummy cell $C_{BL}$ is the capacitance of a bitline VDD is the voltage from power supply.

The source of VDD in FIG. 1 which determines the voltage Vsignal on the bitline in equation 1 is the stored voltage at the cell node of a capacitor such as Cs1 or Cs2.

The stored voltage is written to the cell node through SA operation and cell access transistor.

During the test mode of operation, the storage capacitors Cs1 and Cs2 of dummy cells NC1 and NC2 are activated continuously, as in that mode of operation the signal DWL is turned ON continuously from time t1 to t6 connecting the node of capacitor Cs3 via node 1T to true bitline BT and the node of capacitor Cs4 via node 1C to complementary bitline BC. Total bitline and complementary bitline capacitance connected to each of the true bitline BT and the complementary bitline BC is increased from a value of about $C_{BL}$ for each of the capacitors $C_{BL1}/C_{BL2}$ to a value of about $C_{BL}+Cs$ respectively.

Accordingly, when WLi is activated to measure a cell data margin of memory cell of T1, the signal developed at the true bitline BT is determined by the capacitor ratio of the capacitance of the bitline capacitor $C_{BL1}$ to the capacitances Cs of the storage capacitor Cs1 and the dummy capacitor Cs3. The sensing signal developed at true bitline BL is expressed by Equation 2.

$$Vsignal = Cs*VDD(2*(Cs)+C_{BL}) \quad \text{(Equation 2)}$$

Likewise, when WLj is activated to measure a cell data margin of memory cell of T2, the signal developed at complementary bitline BC is determined by the capacitor ratio for complementary bitline BC capacitor $C_{BL2}$ to the storage capacitor Cs2 and the dummy capacitor Cs4. The signal change developed at the complementary bitline BC by the dummy cell is also shown by Equation 2.

Figure 3:
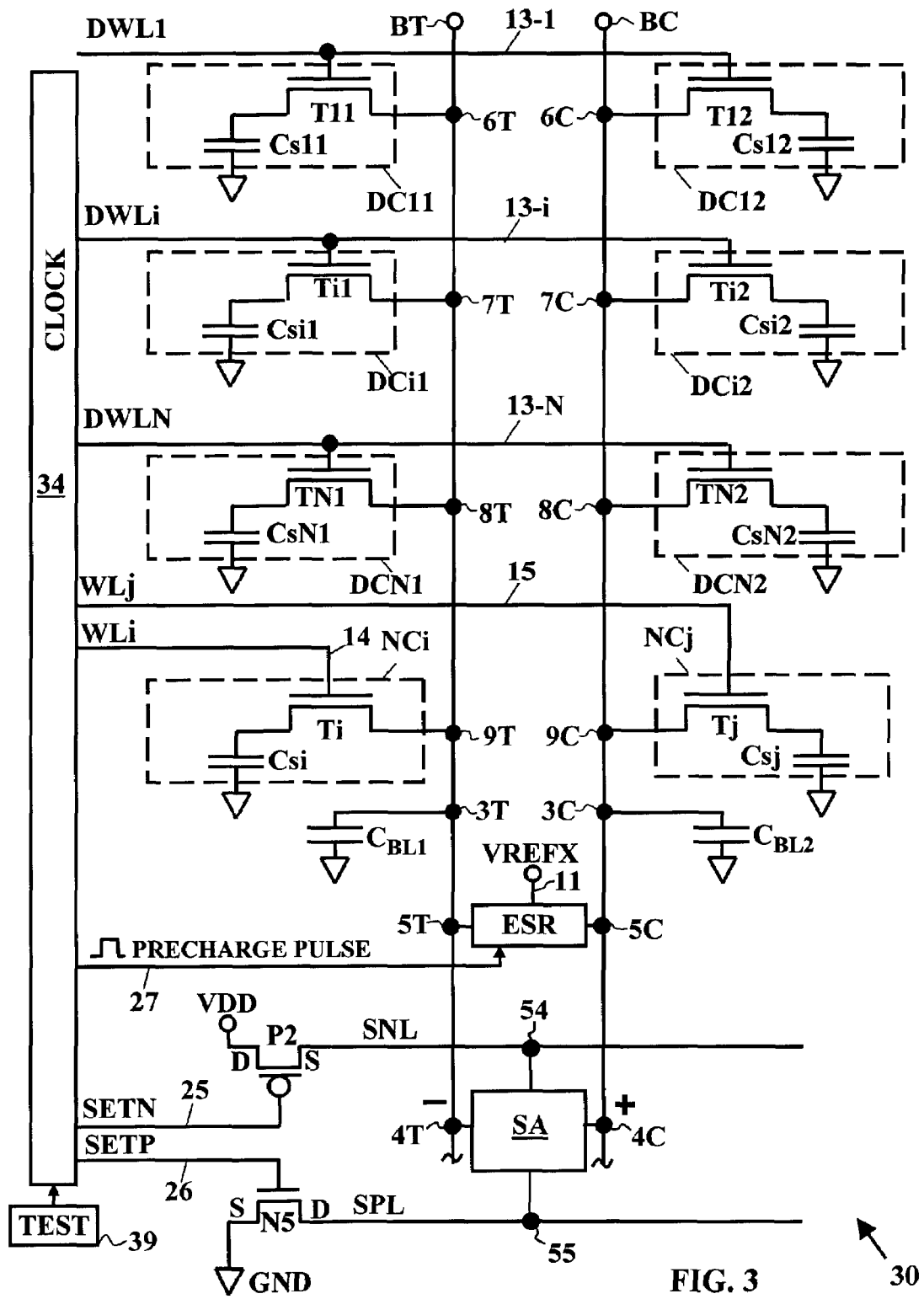
FIG. 3 is a schematic circuit diagram of a memory system in accordance with this invention for measuring the cell data margin in accordance with this invention in which a row of normal cells and multiple rows of dummy cells are used within an array.

FIG. 3 is a schematic circuit diagram of a memory system 30 in accordance with this invention for measuring the cell data margin in which a row of normal cells and multiple rows of dummy cells are used within an array. As in FIG. 1 there is a bitline pair connection to memory cells, which includes a true bitline BT and a complementary bitline BC. The system includes two columns of normal and dummy cells including column "1" for the true bitline and column "2" for the complementary bitline. The first column (for the true bitline) includes several dummy cells DC11, . . . , DCN1, . . . DCN1 and a normal cell NC1. The second column (for the complementary bitline) includes several dummy cells DC12, . . . , DCi2, . . . , DCN2 and the normal cell NC2. FIGS. 4A, 4B, 4C and 4D show four timing diagrams of the activated and un-activated mode of operation of the system 30 of FIG. 3.

The true bitline BT is connected through the node 2T to address true normal cell NC1 and other elements of the circuit 10. The complementary bitline BC is connected through node 2C to address complementary normal cell NC2 and other elements of the circuit 10.

A clock 34 includes a TEST input 39, several clock output lines including several dummy word lines 13-1, . . . , 13-i, . . . and 13-N, wordline WLi 14, wordline WLj 15, and lines to a cross coupled sense amplifier SETN line 25 and SETP line 26.

Each of the two normal cells NC1 and NC2 and each of the several dummy cells DC11, . . . , DCN1, . . . DCN1 and a normal cell NC1; and dummy cells DC12, . . . DCi2, . . . , DC2 includes a single storage capacitor Cs and an NFET transistor with the source drain circuit in series with one terminal of a capacitor with a capacitance value of Cs and the other terminal of the capacitor Cs connected to ground GND.

The dummy cell DC11 includes NFET T11 and storage capacitor Cs11. Transistor T11 has one end of its source/drain circuit connected to a terminal of a storage capacitor Cs11, which is connected at its other terminal to reference potential ground (GND). The other ends of the source/drain circuit of the dummy cell transistor T11 is connected through node 6T to the true bitline BT.

The dummy cell DC12 includes NFET T12 and storage capacitor Cs12. Transistor T12 has one end of its source/drain circuit connected to a terminal of a storage capacitor Cs12, which is connected at its other terminal to reference potential ground (GND). The other ends of the source/drain circuits of the dummy cell transistor T12 is connected through node 6C to the complementary bitline BC.

The dummy cell DCi1 includes NFET Ti1 and storage capacitor Csi1. Transistor Ti1 has one end of its source/drain circuit connected to a terminal of a storage capacitor Csi1, which is connected at its other terminal to reference potential ground (GND). The other ends of the source/drain circuit of the dummy cell transistor Ti1 is connected through node 7T to the true bitline BT.

The dummy cell DCi2 includes NFET Ti2 and storage capacitor Csi2. Transistor Ti2 has one end of its source/drain circuit connected to a terminal of a storage capacitor Csi2, which is connected at its other terminal to reference potential ground (GND). The other ends of the source/drain circuits of the dummy cell transistor Ti2 is connected through node 7C to the complementary bitline BC.

The dummy cell DCN1 includes NFET TN1 and storage capacitor CsN1. Transistor TN1 has one end of its source/drain circuit connected to a terminal of a storage capacitor CsN1, which is connected at its other terminal to reference potential ground (GND). The other ends of the source/drain circuit of the dummy cell transistor TN1 is connected through node 8T to the true bitline BT.

The dummy cell DCN2 includes NFET TN2 and storage capacitor CsN2. Transistor TN2 has one end of its source/drain circuit connected to a terminal of a storage capacitor CsN2, which is connected at its other terminal to reference potential ground (GND). The other ends of the source/drain circuits of the dummy cell transistor TN2 is connected through node 8C to the complementary bitline BC.

In summary, each of the transistors T11 T12, Ti1, Ti2, TN1, TN2, T1, and T2, has one end of its source/drain circuit connected respectively to a terminal of a storage capacitor Cs11, Cs12, Csi1, Csi2, CsN1, CsN2, Csi, and Csj. Each of those capacitors is connected at its other terminal to the reference potential ground (GND). The other ends of the source/drain circuits of transistors T11, Ti1, TN1, and Ti are connected through nodes 6T to 9T to the true bitline BT. The other ends of the source/drain circuits of transistors T12, Ti2, TN2, and T2 are connected through nodes 6C to 9C to complementary bitline BC.

The normal cell NCi includes the NFET Ti and the storage capacitor Csi. Transistor T1 has one end of its source/drain circuit connected to a terminal of a storage capacitor Cs1, which is connected at its other terminal to reference potential ground (GND). The other end of the source/drain circuit of memory cell transistor Ti is connected via node 9T to the true bitline BT.

The normal cell NC2 includes the NFET Tj and the storage capacitor Cs2. Transistor Tj has one end of its source/drain circuit connected to a terminal of a storage capacitor Csj, which is connected at its other terminal to reference potential ground (GND). The other end of the source/drain circuit of memory cell transistor Tj is connected via node 9C to the complementary bitline BC.

The source/drain circuit of the transistor T11 connects between the true bitline BT and one terminal of the capacitor Cs11. The source/drain circuit of the transistor T12 connects between the complementary bitline BC and one terminal of the capacitor Cs12. The source/drain circuit of the transistor Ti1 is connected between the true bitline BT and one terminal of the capacitor Csi1. The source/drain circuit of the transistor Ti2 connects between the complementary bitline BC and one terminal of the capacitor Csi2.

The source/drain circuit of the transistor TN1 connects between the true bitline BT and one terminal of the capacitor CsN1. The source/drain circuit of the transistor TN2 connects between the complementary bitline BC and one terminal of the capacitor CsN2. The source/drain circuit of the transistor Ti is connected between the true bitline BT and one terminal of the capacitor Cs1. The source/drain circuit of the transistor Tj connects between the complementary bitline BC and one terminal of the capacitor Cs2.

The multiple dummy wordline signals DWL1, . . . , DWLi, . . . , and DWLN (where "i" is an integer between 1 to N) are connected by the horizontally extending, parallel lines 13-1, . . . , 13-$i$, . . . , and 13-N to the gate electrodes of NFET devices in two columns of dummy cells. The line 13-1 is connected to the gate electrodes of the transistors T11 and T12 in both of the dummy cells DC11 and DC12 respectively in row "1." The line 13-$i$ is connected to the gate electrodes of transistors TN1 and Ti2 in dummy cells DCN1 and DCi2 respectively in row "i." The line 13-N is connected to the gate electrodes of transistors TN1 and TN2 in the dummy cells DCN1 and DCN2 in row "N."

Figure 4A:
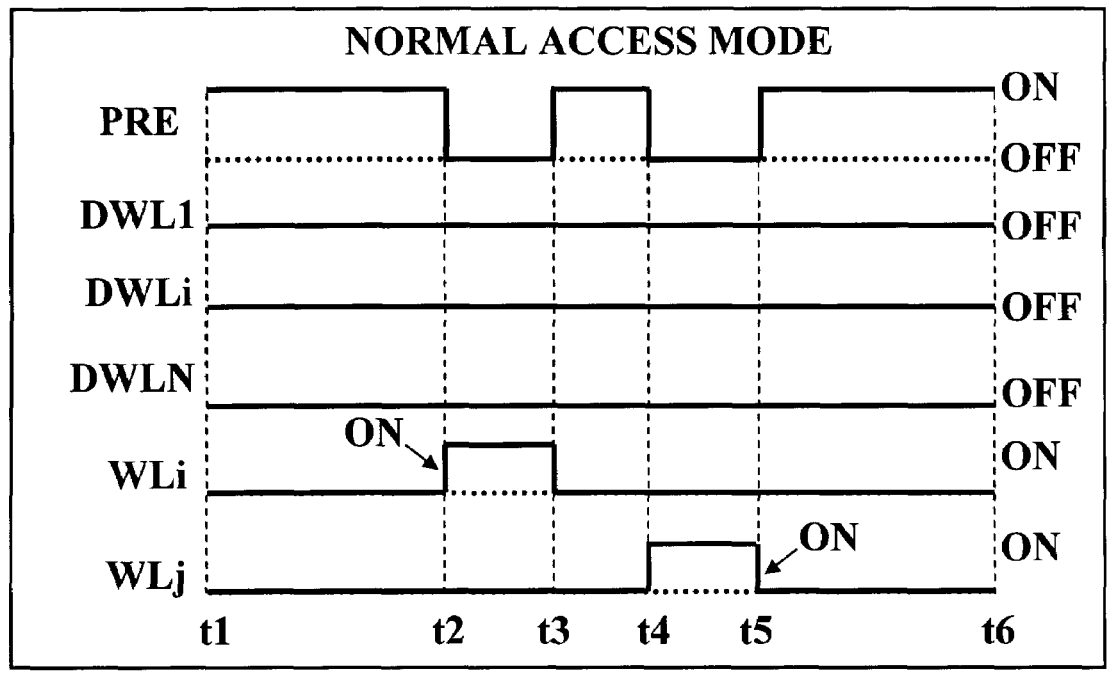
FIGS. 4A, 4B, 4C and 4D show four timing diagrams of the activated and un-activated mode of operation of the system of FIG. 3.
Figure 4B:
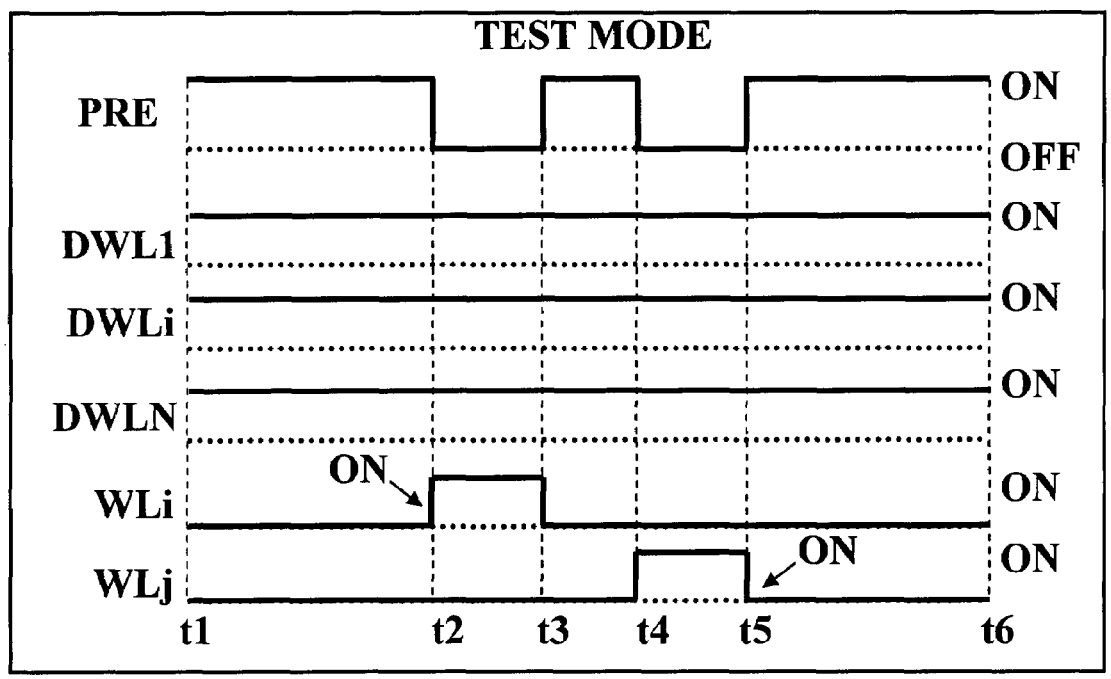

During the test mode, each dummy wordline signal DWL (DWLi) is controlled independently to give different combinations of bitline capacitor capacitance values as shown in FIGS. 4A–4D. For example, referring to FIG. 4A, if we turn on DWL1 from time t2 to t3, the situation will be same as single DWL case as in FIG. 1. However, as shown in FIG. 4B, if we turn on all of the dummy wordline signals DWL1, . . . , DWLi, . . . DWLN, then the true bitline BT and complementary bitline BC capacitor will be increased to ($C_{BL}$+Cs*i) where "i" is the number of rows of dummy and normal cells.

Figure 4C:
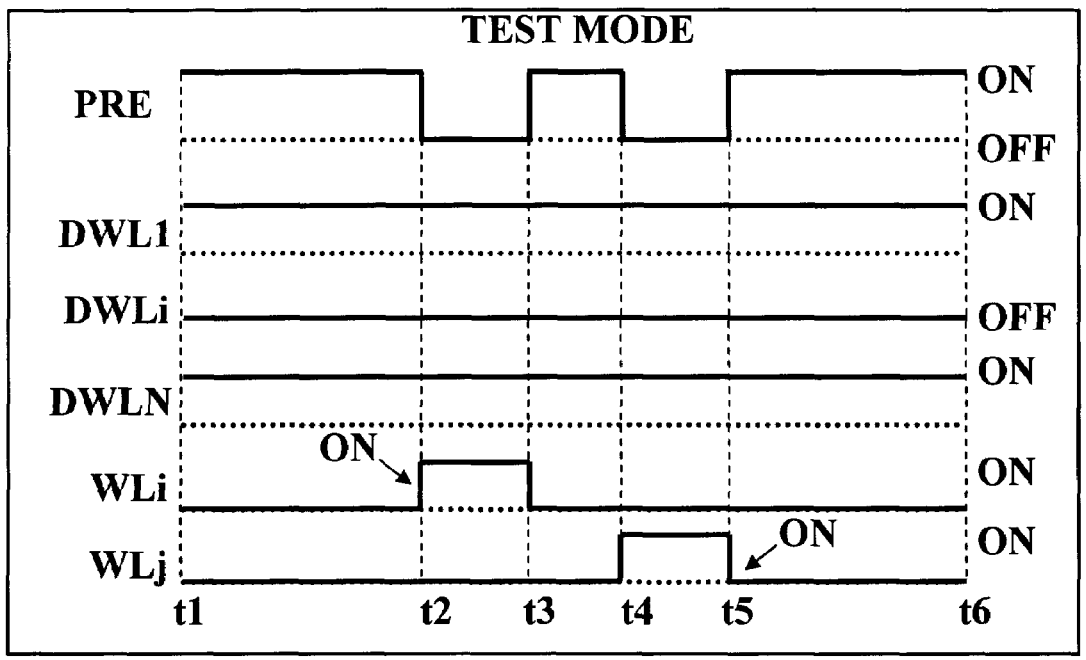
Figure 4D:
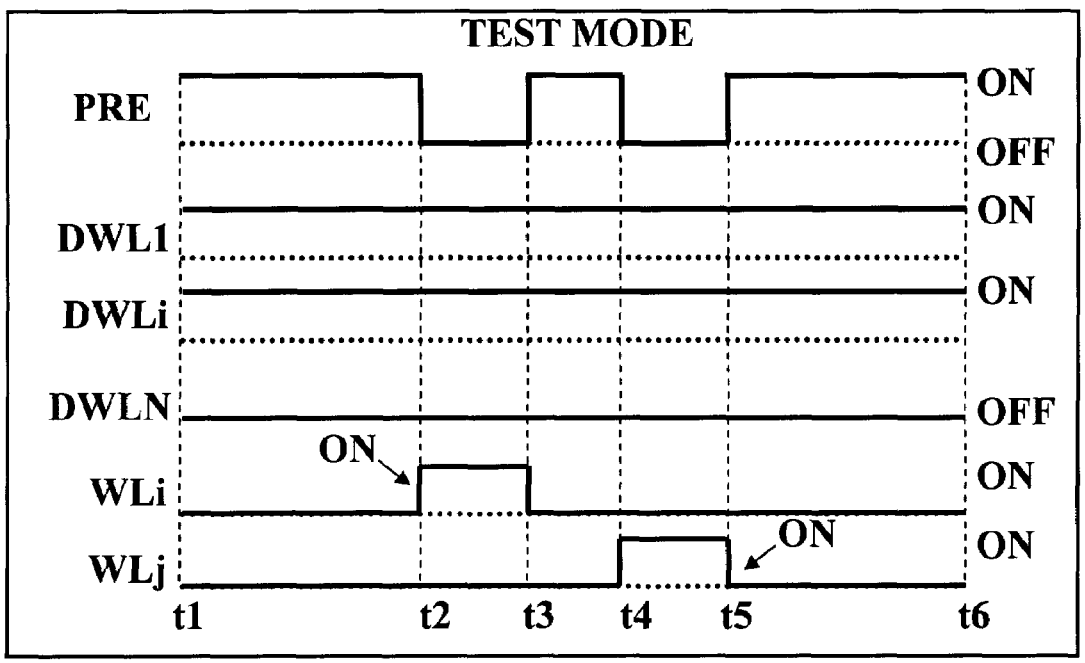

This reduces the signal development at the true bitline BT or the complementary bitline BC. FIG. 4C illustrates a situation in which dummy wordlines DWL1 and DWLN are ON but dummy wordline DWLi is OFF, FIG. 4D illustrates a situation in which dummy wordlines DWL1 and DWLi are ON but dummy wordline DWLN is OFF so that any permutation of wordlines DWL1, . . . DWLi, . . . DWLN can be on or OFF to give varying different values of capacitance for a given bitline pair BT/BC.

By using multiple dummy cells, we can simulate to very tiny signal. The sensing signal development at the bitline BT or BC is expressed by Equation 3.

$$Vsignal=Cs*VDD((N+1)*(Cs)+C_{BL}) \qquad \text{(Equation 3)}$$

where:
N is the Number of rows of dummy cells
Cs is the capacitance of each normal cell and each dummy cell
$C_{BL}$ is the capacitance of a bitline
VDD is the voltage from power supply By using this method, we can measure the cell data margin of each memory cell.

What is claimed is:

1. A memory array comprising:
   at least one bitline;
   at least one normal cell for actual data storage with the normal cell including a normal cell switch and a normal cell capacitor;
   a clock providing a wordline drive signal to the normal cell switch for connecting the normal cell capacitor to the bitline;
   at least one storage capacitor;
   at least one dummy cell with the dummy cell including a dummy cell switch and a dummy cell capacitor; and
   the clock providing at least one dummy wordline drive signal to the dummy cell switch in response to a testing signal for connecting the dummy cell capacitor to the bitline.

2. The memory array of claim 1 wherein dummy cell capacitor is connected to a bitline or a complementary bitline during the test mode by turning on the dummy wordline drive signal.

3. The memory array of claim 1 wherein the dummy cell capacitor is disconnected from a bitline or a complementary bitline during the mission mode by turning off the dummy wordline drive signal.

4. The memory array of claim 1 wherein, dummy cells are connected to normal a bitline or a complementary bitline within the same array as the normal cell array.

5. The memory array of claim 1 wherein, dummy wordline driver output is connected to dummy cell gate likewise normal wordline driver connected to normal cell array.

6. The memory array of claim 1 wherein in a test mode, the dummy cell dilutes the signal level at BT by increasing bit line capacitance by addition thereto of the dummy cell capacitance.

7. The memory array of claim 1 wherein, a number of dummy wordlines are used to simulate different cell data margins.

8. A memory array comprising:
   bitline pairs including a true bitline and a complementary bitline;
   at least one sense amplifier connected to the true bitline and a complementary bitline;
   at least one row of normal cells for actual data storage, with each normal cell including a normal cell switch and a normal cell capacitor;
   a clock providing a wordline drive signal to a normal cell switch for connecting a normal cell capacitor to a bitline;
   a true bitline storage capacitor connected to true bitline and a complementary bitline storage capacitor connected to the complementary bitline;
   a row of dummy cells with each dummy cell, with each dummy cell including a dummy cell switch and a dummy cell capacitor; and
   the clock providing at least one dummy wordline drive signal to the dummy cell switch in response to a testing signal for connecting the dummy cell capacitor to the bitline.

9. The memory array of claim 8 wherein dummy cell capacitor is connected to a bitline or a complementary bitline during the test mode by turning on the dummy wordline drive signal.

10. The memory array of claim 8 wherein the dummy cell capacitor is disconnected from a bitline or a complementary bitline during the mission mode by turning off the dummy wordline drive signal.

11. The memory array of claim 8 wherein, dummy cells are connected to normal a bitline or a complementary bitline within the same array as the normal cell array.

12. The memory array of claim 8 wherein, dummy wordline driver output is connected to dummy cell gate likewise normal wordline driver connected to normal cell array.

13. The memory array of claim 8 wherein, in a test mode, the dummy cell dilutes the signal level at BT by increasing bit line capacitance by addition thereto of the dummy cell capacitance.

14. The memory array of claim 8 wherein, a plurality of dummy wordlines are used to simulate different cell data margins.

15. A method of testing a memory array with at least one bitline, at least one normal cell for actual data storage with the normal cell including a normal cell switch and a normal cell capacitor, a clock providing a wordline drive signal to the normal cell switch for connecting the normal cell capacitor to the bitline, at least one storage capacitor, comprising:
   providing at least one dummy cell with the dummy cell including a dummy cell switch and a dummy cell capacitor, and
   providing at least one dummy wordline drive signal from the clock to the dummy cell switch in response to a testing signal for connecting the dummy cell capacitor to the bitline.

16. The method of claim 15 wherein dummy cell capacitor is connected to a bitline or a complementary bitline during the test mode by turning on the dummy wordline drive signal.

17. The method of claim 15 including disconnecting the dummy cell capacitor from a bitline or a complementary bitline during the mission mode by turning off the dummy wordline drive signal.

18. The method of claim 15 wherein, dummy cells are connected to normal a bitline or a complementary bitline within the same array as the normal cell array.

19. The method of claim 15 wherein, dummy wordline driver output is connected to dummy cell gate likewise normal wordline driver connected to normal cell array.

20. The method of claim 15 wherein, a number of dummy wordlines are used to simulate different cell data margins.

* * * * *